United States Patent [19]

Kausch

[11] Patent Number: 4,476,215
[45] Date of Patent: Oct. 9, 1984

[54] NEGATIVE-ACTING PHOTORESIST COMPOSITION

[75] Inventor: William L. Kausch, Cottage Grove, Minn.

[73] Assignee: Minnesota Mining and Manufacturing Company, Saint Paul, Minn.

[21] Appl. No.: 554,886

[22] Filed: Nov. 25, 1983

[51] Int. Cl.³ .............................................. G03C 1/68
[52] U.S. Cl. ............................... 430/281; 204/159.15; 204/159.16; 430/287; 430/288; 430/905; 430/910
[58] Field of Search ............... 430/281, 287, 288, 905, 430/910; 204/159.15, 159.16, 159.22

[56] References Cited

U.S. PATENT DOCUMENTS

| | | | |
|---|---|---|---|
| 3,115,474 | 12/1963 | Smith | 260/2 |
| 3,240,720 | 3/1966 | Smith | 260/2 |
| 3,318,930 | 5/1967 | Fram et al. | 260/404.5 |
| 3,440,242 | 4/1969 | Smith | 260/239 |
| 3,895,949 | 7/1975 | Akamatsu et al. | 96/86 P |
| 3,954,475 | 5/1976 | Bonham et al. | 96/67 |
| 3,987,037 | 10/1976 | Bonham et al. | 260/240 D |
| 4,072,527 | 2/1978 | Fan | 96/87 R |
| 4,072,528 | 2/1978 | Bratt | 96/87 R |
| 4,113,592 | 9/1978 | Rybny et al. | 430/288 |
| 4,139,391 | 2/1979 | Ikeda et al. | 430/288 |
| 4,264,708 | 4/1981 | Chambers et al. | 430/288 |
| 4,271,259 | 6/1981 | Breslow et al. | 430/288 |
| 4,304,923 | 12/1981 | Rousseau | 430/284 |
| 4,320,189 | 3/1982 | Taguchi et al. | 430/288 |
| 4,378,411 | 3/1983 | Heilmann et al. | 430/287 |
| 4,435,497 | 3/1984 | Irving | 430/288 |

*Primary Examiner*—Jack P. Brammer
*Attorney, Agent, or Firm*—Donald M. Sell; James A. Smith; Mark A. Litman

[57] ABSTRACT

Negative-acting photoresist compositions are used in a variety of reproductive and imaging systems. Significant problems with these compositions are their inability to cure to a tough, solvent resistant state, tackiness in the uncured compositions, and the tendency of the uncured compositions to flow under force. The present composition combines six ingredients to form a photoresist composition which overcomes many of these problems in the prior art.

20 Claims, No Drawings

NEGATIVE-ACTING PHOTORESIST COMPOSITION

FIELD OF THE INVENTION

This invention relates to negative-acting photoresist compositions, and particularly negative-acting photoresist compositions which are useful in non-silver halide graphic arts films and resist imaging systems.

BACKGROUND OF THE INVENTION

Negative-acting photoresist compositions have been used commercially for many years. These compositions are applied as a layer over a substrate and then subjected to actinic radiation. The actinic radiation causes a change in solubility of the layer, usually by photoinitiated polymerization of components within the layer. When the imaged layer is subsequently treated (e.g., washed and lightly scrubbed) with a developer solution, such as an aqueous alkaline solution of pH greater than 12, the non-light struck areas of the layer are washed away. If the original layer contained a colorant material (e.g., dyes or pigment), development would leave an imagewise distribution of the colored layer as a final image. If an etching or plating process is performed on the developed layer, an etched or plated image is deposited on the substrate in the exposed areas where the photoresist layer had been removed by development. A wide variety of photoresist compositions exist in the art, and many have been used as photosensitive printing plate compositions in lithographic technology. Examples of photoresist compositions known in the art include U.S. Pat. Nos. 3,395,016, 3,469,982, 3,639,185 and 4,193,797, as well as Canadian Pat. Nos. 976,352 and 976,353.

Most of the negative-acting photoresist compositions known in the art use ethylenically unsaturated materials in combination with a free radical generating photoinitiator as the active ingredients. Acrylic functional materials (i.e., acrylyol and methacrylyol functional materials) are generally preferred in the art because of their speed, toughness upon cure, and moderate cost. Printing plate compositions, in particular, rely on the use of acrylic functional materials in various forms such as monomers, oligomers and polymers with acrylic functionality. Examples of such printing plate compositions and the use of various acrylic functional materials are shown, for example, in U.S. Pat. Nos. 4,316,949, 4,228,232, 4,104,072 and 3,954,475. Many of these compositions have found acceptable commercial uses, but they have tended to be weak in certain technically important areas, particularly toughness of the cured composition, tackiness of the uncured composition, and cold flow of the resist layer.

SUMMARY OF THE INVENTION

The present invention relates to a negative-acting photoresist composition comprising at least six components. The components comprise (1) a polyfunctional acrylate monomer, (2) an organic, polymeric, polyfunctional film-forming binder with pendant acrylate groups, (3) a polyfunctional, thermally activated, acid group-cross-linking agent, (4) an active photosensitive free radical generator, (5) a non-active photosensitive free radical generator, and (6) an acid group bearing polymeric binder. The compositions of the present invention preferably contain a polyfunctional oligomeric acrylate (other than the one used as the film-forming binder with pendant acrylate groups) as a seventh component. Other imaging layer adjuvants such as spectral sensitizers, dyes, pigments, fillers, and coating aids may also be present in the photosensitive layer.

DETAILED DESCRIPTION OF THE INVENTION

The negative-acting photoresist composition of the present invention comprises at least six components. The polyfunctional acrylate monomer must have at least two acrylic functionalities thereon (either acrylyol or methaacrylyol, with 2–8 groups preferred and 3–6 groups most preferred). The monomer should generally be present as 10–50 weight percent of the reactive composition and may comprise more than a single monomer component. Preferably the monomer comprises 30–50 weight percent.

The organic, polymeric polyfunctional pendant acryloyl (including methacryloyl) group bearing film-forming binder should have a molecular weight equal to or greater than 800, and preferably has a molecular weight between 1,000 and 100,000. More preferably, the binder has a molecular weight between 1,000 and 20,000. Any pendant acryloyl group may be present on the binder as on the end of bridging groups such as hydrocarbon chains (e.g., alkylene groups), carbamate groups, etc. The oligomer may have pendant acid groups in addition to the acryloyl groups as disclosed in U.S. Pat. No. 4,304,923. The presence of the binder tends to reduce the tackiness of the coated composition and provides cross-linking sites. The binder should be present in an amount between 10–60 weight percent of the composition or the reactive components in the photosensitive layer.

The polyfunctional, thermally activated acid reactive cross-linking agent should be present in an amount between 0.05 and 2.5% by weight of the composition or the reactive components. This component can be used to reduce the cold flow of the resist and reduce tack of the applied resist layer.

The active photosensitive free radical generator should be present in an amount between 1 and 10% by weight of the composition or the reactive components of the photosensitive layer. The non-active photosensitive free radical generator should also be present in an amount of 1–10% by weight of reactive components of the photosensitive layer. The combination of these two materials provides a synergistic activity to the photosensitive properties of the composition, and the use of the active photosensitive free radical generator tends to remove some amount of low molecular weight materials from the composition which acts to further toughen the polymerized product.

The terms "active" and "non-active", as they refer to free radical generators, have definite and critical meaning according to the practice of the present invention. An "active" free radical generator is a compound which, in the absence of any sensitizing compounds, can photoinitiate the cure of a 3 micrometer wet thickness film of methylmethacrylate to a non-tacky film when present as 5% by weight of the methylmethacrylate and irradiated in the absence of $O_2$ with $3 \times 10^{-5}$ ergs/cm$^2$ of 360 to 430 radiation. A "non-active" free radical generator is a compound which is not an active free radical generator at 360–430 nm, but when spectrally sensitized (e.g., with Michler's ketone) will, in combination with the spectral sensitizor perform the function of an active free radical generator. That is, the spectrally sensitized non-active free radical generator will cure a 3 micrometer wet thickness layer of methylmethacrylate to a non-tacky film under the conditions described for the definition of an active photoinitiator. Spectral sensitizers are preferably used in molar proportions of 0.01/1 to to 2/1 for the non-active free radical generator. More preferably ratios of 0.05 to 1.5 are used (sensitizer/photoinitiator). This would be equivalent to 0.01 to 20% by weight of the reactive components, preferably 0.05 to 15% by weight of reactive components, and most preferably 0.05 to 5% by weight of reactive components or the composition. Of course any effective (i.e., spectral sensitizing) amount of a spectral sensitizer is useful.

The acid group bearing polymeric binder should have a molecular weight equal to or greater than 800, and preferably between 1,000 and 100,000. More preferably, the binder has a molecular weight between 1,000 and 20,000. Any pendant acid group may be present in the binder. It is preferred to have carboxylic acid groups, but sulfonic, phosphoric or carboxylic anhydride groups may also be used. The polymer should have an acid equivalent weight of 1,000 or less. The polymer is not necessarily a film-forming agent. This binder must be present in amounts of 10-60% by weight of the composition.

The optional seventh component, the polyfunctional oligomeric acrylic functional material is useful in amounts up to 60% by weight of the composition or the reactive components of the photosensitive composition. The oligomer is preferably present in an amount of between 1 and 60% by weight. The oligomer preferably has a molecular weight greater than 5,000 and less than 50,000, more preferably between 5,000 and 30,000, and most preferably between 10,000 and 15,000. Examples of preferred oligomers are shown in U.S. Pat. Nos. 4,316,949, 4,304,923 and 4,153,778. Although the presence of carboxylic acid groups on these oligomers is preferred, their presence is not essential to the practice of the present invention.

The polyfunctional acrylate monomers according to the present invention are well known in the art and include, for example, such materials as the polyacrylate and polymethacrylate esters of alkanepolyols, e.g., pentaerythritol tetraacrylate, tris(2-acryloxyethyl)isocyanurate, tris(2-methacryloxyethyl) tetrahydrofurfurylmethacrylate, 1-aza-5-acryloxymethyl-3,7-dioxabicyclo [3,0,0] octane (ADOZ), bis[4-(2-acryloxyethyl)phenyl]dimethyl methane, diacetone acrylamide, and acrylamidoethyl methacrylate. Such monomers are disclosed in U.S. Pat. Nos. 3,895,949, 4,037,021 and 4,304,923.

The organic polymeric polyfunctional acid group bearing binder may comprise any polymeric backbone having acid pendant groups. Preferably the acid pendant groups are selected from carboxylic acid groups, sulfonic acid groups, phosphoric acid groups and anhydrides. Poly(ethylenically unsaturated) addition polymers are preferred for the backbone, but as previously noted, any polymeric binder with pendant acid groups is useful. The preferred binder according to the practice of the present invention is a copolymer of styrene and maleic anhydride having a molecular weight of between 1,000 and 3,000. These polymers are well-known in the art. Examples include commercially available styrene/maleic anhydride copolymers, ethylene/maleic anhydride copolymers, and other carboxylic acid anhydride copolymers with ethylenically unsaturated comonomers.

Any polyfunctional, thermally activated acid reactive cross-linking agent is useful in the practice of the present invention. Any material having at least two groups thermally reactable with the acid functionalities present on the binder would be useful in the practice of the present invention. The preferred class of cross-linking agent includes the aziridines, as disclosed in U.S. Pat. Nos. 3,115,482; 3,240,720; 3,318,930; and 3,440,242. All thermally activated epoxy resins will also perform as these acid cross-linking agents. Examples include difunctional cycloaliphatic epoxides such as ERL-4221 available from Union Carbide. Difunctional epoxide-aziridine compounds disclosed in U.S. Pat. No. 3,240,720 constitute an example of the usefulness of both epoxides and aziridines. These cross-linking agents should be used in an amount between 0.05 and 2.5 weight percent of the composition or the reactive components of the composition.

Any active photosensitive free radical photoinitiator can be used in the practice of the present invention. The preferred class of materials within this group are the s-triazines as disclosed in U.S. Pat. Nos. 3,954,475 and 3,987,037. These materials are generically known as chromophor-substituted vinylhalomethyl s-triazines. These compounds are also acrylate reactive, photosensitive free radical generators and are generally used in amounts of 1-10% by weight of the composition, and preferably as 2-8% by weight of the composition.

The photosensitive, non-active, free radical generator is a generic class of materials well known in the art. Such materials as photosensitive aromatic iodonium salts, sulfonium salts, benzophenones, phosphonium salts, quinones, nitrozo compounds, mercapto compounds, biimidazoles, triaryl imidazoles and all other non-active photosensitive free radical initiators would be useful in the practice of the present invention. Such free radical generators are disclosed in such art as U.S. Pat. Nos. 3,729,313, 3,887,450, 3,895,949, 4,043,819, 4,058,400 and 4,058,401. This photosensitive, non-active, free radical generator is generally used in amounts of 1-10% by weight of the composition, and preferably between 1.5 and 7% by weight of the composition.

The polyfunctional acrylate oligomers useful in the practice of the present invention are generally well known in the art. These oligomers comprise intermediate length polymer backbones having pendant acrylic (acrylyol or methacrylyol) or polyacrylic groups. The backbones may comprise a host of materials from various chemical classes such as the polyolyls disclosed in U.S. Pat. No. 4,304,923 or other free hydrogen containing backbones which can be reacted with isocyanate or caprolactone terminated acrylic or polyacrylic groups. Preferably the polyfunctional acrylate oligomer has an acrylic equivalent weight between 100 and 5,000, with at least two acrylic groups per molecule. According to the teachings of U.S. Pat. No. 4,304,923 which includes the most preferred oligomers of the present invention, as many as 12 or 16 acrylic groups can easily be present on the oligomer. Molecular weights for the oligomer are generally between 3,000 and 50,000, preferably between 5,000 and 30,000, and most preferably between 10,000 and 20,000. The oligomer can be present in amounts up to 60% by weight of the composition, is preferably present in amounts between 1 and 60% by weight, and more preferably is present in amounts between 4 and 40% by weight of the composition.

A wide spectrum of other materials known to be useful in photoresist lithographic compositions can be used according to the present invention. For example, spectral sensitizers for the iodonium salts as disclosed in U.S. Pat. No. 4,250,053 may be used, as can Michler's ketone and other sensitizers for either or both of the photosensitive free radical generators. Dyes, pigments, fillers, antistatic agents, lubricants, surfactants, and other coating aids may be used as desired in the present invention. These and other aspects of the invention will be further shown in the following non-limiting examples.

EXAMPLES 1-8

A stock solution used in all of the following examples was prepared by mixing, in parts by weight:

| | |
|---|---|
| pentaerythritol tetraacrylate | 28 |
| partially esterified 1:1 styrene: maleic anhydride resin | 38 |
| the reaction product of a 5,000-10,000 molecular weight polyol and 0.9 molar equivalents of isocyanatoethylmethacrylate per mole of available hydroxyl groups | 17 |
| the carboxylic acid substituted polyacryloyl functional urethane oligomer of Example 1 of U.S. Pat. No. 4,304,923 | 3 |
| cyan dye (Pylam Solvent Blue) | 3 |
| bifunctional aziridine | 0.08 |

The following photoinitiators and sensitizers were used in each of the Examples:

| | |
|---|---|
| (1) 5% by weight s-triazine 2 | |
| (2) 10% by weight s-triazine 2 | |
| (3) 4% by weight diphenyliodonium hexafluorophosphate and 2% Michler's ketone (sensitizer) | |
| (4) 8% by weight diphenyliodonium hexafluorophosphate and 4% Michler's ketone | |
| (5) 5% by weight s-triazine 2 and 2% Michler's ketone | |
| (6) 4% by weight diphenyliodonium hexafluorophosphate and 5% s-triazine 2 | |
| (7) 2% by weight Michler's ketone, 4% by weight diphenyliodonium hexafluorophosphate, and 5% by weight s-triazine 2 | |
| (8) 2% by weight Michler's ketone, 4% by weight diphenyliodonium hexafluorophosphate, and 5% by weight s-triazine 1. | | s-triazine 1 has the formula

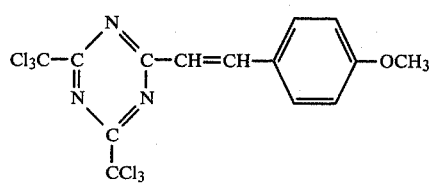

s-triazine 2 has the formula

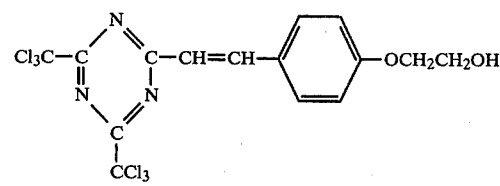

The various coating compositions were applied to a polyester substrate at a coating weight of 350 mg/ft$^2$, exposed in a 2 kw lithographic imaging system for 20 seconds, washed and lightly scrubbed with the developer of Example 3C in U.S. Pat. No. 4,314,022. The following results were obtained.

| Example | Gray Scale | Image Quality | Dot Quality |
|---|---|---|---|
| 1 | 2-3 | weak | undercut |
| 2 | 3-4 | weak | undercut |
| 3 | — | none | none (totally removed) |
| 4 | — | none | none (totally removed) |
| 5 | 2-3 | weak | undercut |
| 6 | 2-3 | weak | undercut |
| 7 | 6-8 | excellent | hard |
| 8 | 6-8 | excellent | hard |

EXAMPLES 9-12

Four formulations were prepared in order to show a range of materials for the various components used in the practice of the present invention. The following materials were used in those formulations:

A. Triacrylate of tris-hydroxyethyl isocyanurate
B. Trimethylolpropane trimethacrylate
C. Pentaerythritol tetraacrylate
D. Pentaerythritol tetramethacrylate
E. G-cure IEM, as reaction product of G-Cure 867 (Henkel Corp.) with 0.9 moles isocyanatoethylmethacrylate (Dow Chemical Co.) per mole of available hydroxyl groups.
F. Compound A of Example 1 of U.S. Pat. No. 4,249,011
G. Compound P-II of U.S. Pat. No. 4,304,923
H. A polyesterdiol having a molecular weight between 5,000 and 10,000.
I. S-Triazine 2
J. Michler's ketone
K. Diphenyliodonium hexafluorophosphate
L. G-Cure 867 acrylate resin
M. A partial ester of styrene/maleic anhydride
N. Aziridine thermal crosslinker (XAMA 2, Cordova Chemical)
O. Bifunctional aziridine thermal crosslinker (HX 877, 3M Co.)
P. Aziridine thermal crosslinker (XAMA 7, Cordova Chemical.

The four photosensitive resist compositions were as follows:

TABLE

| MATERIAL (wt %) | A | B | C | D | E | F | G | H | I | J | K | L | M | N | O | P |
|---|---|---|---|---|---|---|---|---|---|---|---|---|---|---|---|---|
| Example 9 | 35 | — | — | — | 24.5 | — | 10 | — | 5 | 2 | 4 | — | 19 | — | 0.5 | — |
| Example 10 | — | 20 | — | — | — | 20 | — | — | 5 | 2 | 4 | — | — | 0.5 | — | — |
| Example 11 | — | — | 40 | — | 15 | — | — | — | 5 | 2 | 4 | 14 | — | — | — | 0.5 |
| Example 12 | — | — | — | 40 | — | — | 12 | 15 | 5 | 2 | 4 | — | — | — | — | — |

The formulations were prepared at 15% solids in ethylene dichloride:methyl ethyl ketone solution (2:1) and coated onto 4 mil (0.1 mm) polyester with a number 12 Meier bar to provide a coating weight of about 300 mg/ft$^2$. The dried coatings were imaged with a 2 KW Berkey-Ascor exposure unit for approximately 20 seconds with a diazo bulb. Useful images were obtained in all cases.

I claim:

1. A negative-acting photosensitive resist composition comprising:
   (a) at least one polyfunctional acrylate monomer,
   (b) an organic, polymeric, film-forming binder with more than one pendant acryloyl group pendant therefrom,
   (c) a polyfunctional, thermally activated, acid group crosslinking agent,
   (d) an active, photosensitive free-radical generator,
   (e) a non-active, photosensitive free-radical generator, and
   (f) an acid group-bearing polymeric binder.

2. The composition of claim 1 wherein said at least one polyfunctional acrylate monomer comprises 10–50 weight percent of the composition.

3. The composition of claim 1 wherein said film-forming binder comprises between 10 and 60 weight percent of the composition.

4. The composition of claim 1 wherein said acid group crosslinking agent comprises between 0.05 and 2.5 weight percent of the composition.

5. The composition of claim 1 wherein said active, photosensitive free-radical generator and said non-active, photosensitive free-radical generator individually comprises between 1 and 10 weight percent of the composition, and an effective amount of a spectral sensitizer for said non-active free-radical generator is also present.

6. The composition of claim 1 wherein said acid group bearing polymeric binder comprises 10 to 60 weight percent of said composition.

7. The composition of claim 1 wherein said at least one polyfunctional acrylate monomer comprises 10 to 50 weight percent of said composition,
   and film forming binder comprises 10 to 60 weight percent of said composition,
   said acid group crosslinking agent comprises 0.05 to 2.5 weight percent of said composition,
   said active, photosensitive free-radical generator comprises 1 to 10 weight percent of said composition,
   said non-active, photosensitive free-radical generator comprises 1 to 10 weight percent of said composition, and
   said acid group bearing organic polymeric binder comrpises 10 to 60 percent of said composition, said composition further comprising a spectral sensitizer present in an amount equal to 0.1 to 2 molar parts per mole of said non-active, photosensitive, free-radical generator.

8. The composition of claim 7 wherein said at least one polyfunctional acrylate monomer has 2 to 8 groups selected form the group consisting of acryloyl and methacryloyl,
   said film-forming binder has a molecular weight between 1,000 and 100,000, and
   said acid group bearing organic polymeric binder has a molecular weight between 1,000 and 100,000.

9. The composition of claim 8 wherein said acid group bearing organic polymeric binder has pendant carboxylic acid groups.

10. The composition of claim 9 wherein said pendant carboxylic acid groups on said acid group bearing organic polymeric binder provide an acid equivalent weight of 1,000 or less to said binder.

11. The composition of claim 7 wherein said acid group crosslinking agent is selected from the group consisting of aziridines, epoxy resins, and mixed aziridine-epoxy compounds.

12. The composition of claim 8 wherein said acid group crosslinking agent is selected from the group consisting of aziridines, epoxy resins, and mixed aziridine-epoxy compounds.

13. The composition of claim 9 wherein said acid group crosslinking agent is selected from the group consisting of aziridines, epoxy resins, and mixed aziridine-epoxy compounds.

14. The composition of claim 10 wherein said acid group crosslinking agent is selected from the group consisting of aziridines, epoxy resins, and mixed aziridine-epoxy compounds.

15. The composition of claim 8 wherein said acid group bearing organic polymeric binder comprises a copolymer of a carboxylic acid anhydride and an ethylenically unsaturated comonomer.

16. The composition of claim 11 wherein said acid group bearing organic polymeric binder comprises a copolymer of a carboxylic acid anhydride and an ethylenically unsaturated comonomer.

17. The composition of claim 10 wherein said acid group bearing organic polymeric binder comprises a copolymer of a carboxylic acid anhydride and an ethylenically unsaturated comonomer.

18. The composition of claim 11 wherein said acid group bearing organic polymeric binder comprises a copolymer of a carboxylic acid anhydride and an ethylenically unsaturated comonomer.

19. The composition of claim 11 wherein said active, photosensitive free-radical generator comprises an s-triazine.

20. The composition of claim 18 wherein said reactive, photosensitive free-radical generator comprises an s-triazine.

* * * * *